(12) United States Patent
Roscheisen et al.

(10) Patent No.: US 7,115,304 B2
(45) Date of Patent: Oct. 3, 2006

(54) HIGH THROUGHPUT SURFACE TREATMENT ON COILED FLEXIBLE SUBSTRATES

(75) Inventors: Martin R. Roscheisen, San Francisco, CA (US); Karl Pichler, Santa Clara, CA (US)

(73) Assignee: Nanosolar, Inc., Palo Alto, CA (US)

(*) Notice: Subject to any disclaimer, the term of this patent is extended or adjusted under 35 U.S.C. 154(b) by 0 days.

(21) Appl. No.: 10/782,545

(22) Filed: Feb. 19, 2004

(65) Prior Publication Data

US 2005/0186338 A1     Aug. 25, 2005

(51) Int. Cl.
*C23C 16/00* (2006.01)

(52) U.S. Cl. .............................. 427/248.1; 427/255.23; 427/253; 427/255.26; 427/255.28; 427/255.36; 118/728

(58) Field of Classification Search ............. 427/248.1, 427/253, 255.23, 255.26, 255.28, 255.36, 427/177–179, 209, 255.5; 118/718
See application file for complete search history.

(56) References Cited

U.S. PATENT DOCUMENTS

| | | | | |
|---|---|---|---|---|
| 3,114,539 A | * | 12/1963 | Lee et al. ......................... | 432/5 |
| 3,923,556 A | * | 12/1975 | Iszczukiewicz ................. | 148/601 |
| 5,614,273 A | * | 3/1997 | Goedicke et al. ............... | 427/569 |
| 6,716,693 B1 | * | 4/2004 | Chan et al. ..................... | 438/238 |
| 6,830,983 B1 | * | 12/2004 | Marsh .............................. | 438/381 |
| 6,838,114 B1 | | 1/2005 | Carpenter et al. .............. | 427/8 |
| 6,861,094 B1 | | 3/2005 | Derderian et al. .............. | 427/248.1 |
| 6,875,667 B1 | * | 4/2005 | Iizuka et al. .................... | 438/381 |
| 2002/0013487 A1 | * | 1/2002 | Norman et al. ................. | 556/7 |
| 2004/0001922 A1 | * | 1/2004 | Meyer ............................. | 427/430.1 |
| 2005/0172897 A1 | * | 8/2005 | Jansen ............................. | 118/718 |

OTHER PUBLICATIONS

Cutnell and Johnson, Physics, 2001, John Wiley and Sons, 5th edition, p. 71-73.*
M.A. Cameron et al., "Atomic Layer Deposition of $SiO_2$ and $TiO_2$ in Alumina Tubular Membranes: Pore Reduction and Effect of Surface Species on Gas Transport" in *Langmuir 2000*, vol. 16, pp. 7345-7555, published on the web, Jun. 10, 2000, American Chemical Society.
Merriam-Webster Online Dictionary entry for "coil", downloaded from the Internet <http://www.m-w.com/cgi-bin/dictionary?book=Dictionary&va=coiling> downloaded on Jul. 14, 2005.
U.S. Appl. No. 10/782,163 to Brian M. Sager filed Feb. 19, 2005 entitled "Device based on coated nanoporous structure".
U.S. Appl. No. 10/782,233 to Karl Pichler filed Feb. 19, 2005 entitled "Roll-to-roll atomic layer desposition method and system".
U.S. Appl. No. 10/782,017 to Dong Yu et al. filed Feb. 19, 2005 entitled "Solution-based fabrication of photovoltaic cell".

* cited by examiner

*Primary Examiner*—Timothy Meeks
*Assistant Examiner*—Howard Abramowitz

(57) ABSTRACT

One or more substrates may be coiled into one or more coils in such a way that adjacent turns of the coils do not touch one another. The one or more coiled substrates are placed in a treatment chamber where substantially an entire surface of the one or more coiled substrates may be treated with a surface treatment process. One or more spacers may be placed between adjacent layers of the coiled substrate before a full turn of the substrate has been coiled around a carousel.

28 Claims, 5 Drawing Sheets

US 7,115,304 B2

HIGH THROUGHPUT SURFACE TREATMENT ON COILED FLEXIBLE SUBSTRATES

CROSS-REFERENCE TO RELATED APPLICATION

This application is related to commonly-assigned co-pending application Ser. No. 10/782,163, titled "DEVICE BASED ON COATED NANOPOROUS STRUCTURE", which is filed the same day as the present application, the entire disclosures of which are incorporated herein by reference. This application is also related to commonly-assigned, co-pending application Ser. No. 10/782,233, titled "ROLL-TO-ROLL ATOMIC LAYER DEPOSITION METHOD AND SYSTEM", which is filed the same day as the present application, the entire disclosures of which are incorporated herein by reference. This application is also related to commonly-assigned co-pending application Ser. No. 10/782,017, titled "SOLUTION-BASED FABRICATION OF PHOTOVOLTAIC CELL", which is filed the same day as the present application, the entire disclosures of which are incorporated herein by reference.

FIELD OF THE INVENTION

The present invention is directed to the deposition and/or surface treatment of thin films on large area substrates and more specifically to atomic layer deposition in a high-throughput production system.

BACKGROUND OF THE INVENTION

Several forms of surface chemistry and surface treatment depend upon the interaction of a substrate with its environment, including annealing, drying, and exposure to reactive gas. For example, Atomic Layer Deposition (ALD) is a high-quality thin-film deposition technique based on sequential, self-limiting surface reactions. Atomic layer deposition works by exposing a substrate sequentially to two or more reactant vapors or solutions and maintaining the substrate temperature within, for example, a temperature range that depends on the chemistry of the particular ALD reaction. A typical ALD process involves a sequence of two different and alternating surface reactions involving two different gaseous reactants referred to herein as A and B. The ALD system is typically purged of reactant gas in between reactions with a non-reactive purge gas C, and/or is pumped clean of the reactant gases. Sequencing the reactions provides precision in the rate of deposition and allows the use of highly reactive reactants. With each reactant exposure, a self-limiting reaction occurs on the surface of the substrate if the substrate temperature is, for example, within the right temperature range, or alternative energy sources are provided, such as energetic ions or molecules or atoms, ozone, plasma, UV light, etc.

ALD can control the thickness of deposited films at the level of an atomic or sub-atomic layer. Thus films deposited by ALD tend to be uniform over large areas. In addition ALD allows deposition of conformal films on structures having very high aspect ratios (e.g., >>10). A wide variety of materials may be deposited by ALD, including semiconductors, metals, oxides, nitrides, and other materials. ALD techniques can thus deposit thin films one atomic layer at a time, in a "digital" fashion. Such "digital" build-up of material greatly simplifies thickness control, thus reducing both the complexity and cost of thin film deposition.

Many industries, such as the optoelectronics industry, can benefit from the high uniformity, high aspect ratio conformal coating abilities and low cost of ALD. Unfortunately, prior art ALD systems have mostly been made for semiconductor wafer processing, which is oriented to batch processed wafer handling systems. Although existing ALD systems are suitable for the semiconductor industry, they are unsuitable for high volume manufacturing of large area devices such as photovoltaic cells. Current systems are typically designed to coat small area wafers. Scaling up systems that coat a small area at a time might not be practical for coating large area sheets, panels or rolls of material. ALD may be too slow and expensive overall, if only small area batch processing can be performed. Further, surface treatments such as annealing, drying, and exposure to reactive gases cannot be carried out at high-volume for large-area substrates when the surface treatments and/or reactions take place in a relatively smaller treatment chamber.

Thus, there is a need in the art, for a high throughput surface treatment method and system.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Figure 1A:
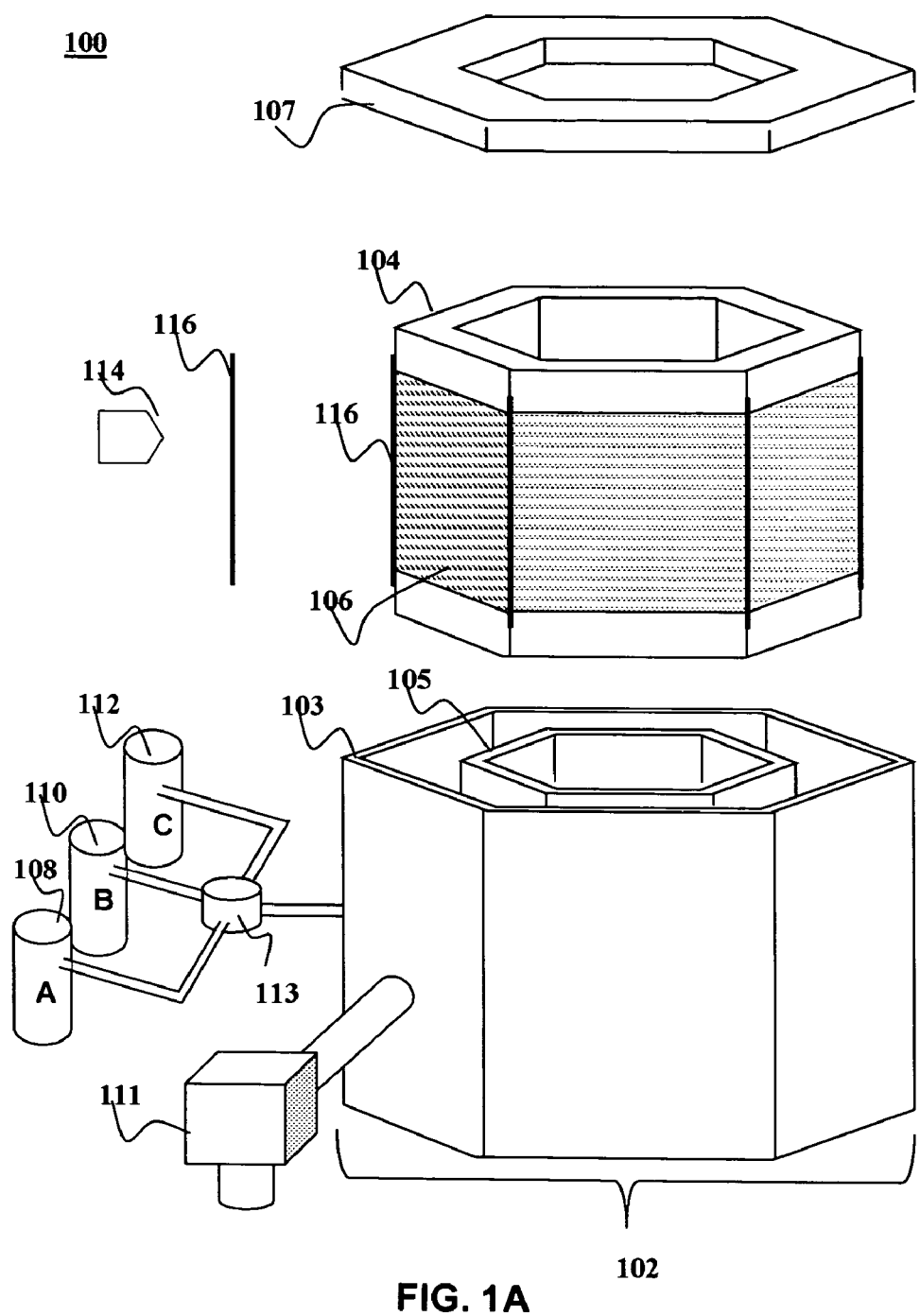
FIG. 1A is a 3-dimensional exploded view schematic diagram of a high throughput atomic layer deposition system according to an embodiment of the present invention.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

The inventors recognized that in atomic layer deposition systems, wherever the reactant gases A, B come in contact with substrate, good coating may be achieved. Consequently, ALD may be readily scaled to coating large substrate areas in each reaction step. Thus, the throughput of an ALD system may be increased by massively scaling the substrate surface area processed during each step (as opposed to scaling up the step speed for each deposition cycle and/or processing many substrates in parallel via, e.g. the number of ALD reaction chambers) This can be achieved by coiling a flexible substrate (e.g., metal or alloy foil, e.g. Al, metalized plastic foil, otherwise coated foils, foils with pre-deposited/processed surface structure and/or patterning, laminates, etc.) in an ALD chamber in such a way that adjacent 'turns or windings' of the foil on the carrier roll, cassette, or carousel do not touch one another. Gaps between adjacent layers of the coiled substrate allow the reactant gases to flow or diffuse into the gaps between adjacent turns and thus reach and be adsorbed or react on the substrate surface(s) to be coated. Each step (A, B, C) of the ALD reaction may then be applied to a massive surface area of the substrate. The basic concept behind the embodiments of present invention is not so much a roll-to-roll implementation (in terms of continuous throughput) but one in which each step may be applied to the entire surface area of the substrate, e.g., in an entire roll. The same approach, with appropriate modifications, can be used to scale up other surface treatment techniques such as substrate annealing, drying, anodization, electro-deposition, electro-polymerization, electro-polishing, cleaning, exposing to chemicals to treat the surface (e.g. selenization of a substrate using $H_2Se$ gas or Se vapor), solution treatments, treatments that require electric fields/current/voltage, etc.

One way to achieve high-volume production in ALD systems of the type described herein is to perform an ALD reaction on an entire roll of substrate material at one time. To do this, it would be useful to fit the entire length of a roll into the ALD chamber so that the A and B half-reactions can be performed without having to remove the substrate from the chamber. In another alternative embodiment, an entire roll of substrate material may be treated at one time by using a system of the type depicted in FIG. 1A. The system 100 includes a surface treatment chamber 102 and a carousel 104 for coiling a flexible substrate 106 in a way that allows gaps between adjacent turns of the coil. Gas sources 108, 110 and 112 provide ALD reactants A, B and purge gas C to the chamber 102. One or more robots 114 place stackable spacers 116 on the carousel 104. An exhaust system 111 removes gas or liquid from within the chamber 102. The gas pressure within the chamber 102 may be adjusted by appropriate control of the gas sources 108, 110 and 112 and the exhaust system 111.

By way of example, the chamber 102 may include an inner wall 103 and an outer wall 105. The substrate 106 may be wound outside the chamber 102 on the carousel 104, which fits between the inner wall 103 and the outer wall 105. The carousel 104 may be loaded into the chamber 102 through the top (or side). A lid 107 seals the top of the chamber 102. By way of example, the chamber 102 may also include equipment for pre-treatment of the substrate 106 by plasma, UV-ozone, heat (e.g., infrared), corona or combinations thereof. In addition, the chamber 102 may include equipment for performing one or more treatment and/or coating steps that are performed prior or subsequent to atomic layer deposition that is performed in the chamber 102, including but not limited to substrate cleaning, annealing, drying, and/or exposure to reactive gas such as Se vapor or $H_2Se$. Such post-ALD steps may include passivation, or coating the ALD treated substrate 106 with, e.g., an organic or inorganic material. In addition, the chamber 102 may be equipped with additional gas low inlets, heaters (e.g., infrared heaters, light sources, or ultraviolet radiation sources, sources for energetic particles such as plasma ions, ozone, etc.) or cooling mechanisms, such as fluid filled tubes or peltier effect (thermoelectric) elements. Furthermore, the chamber 102 may be part of a much larger coating line that may include other equipment for performing pre-ALD and post-ALD treatment of the substrate 106. The wound substrate can also be surface-treated in the absence of ALD processes, e.g. by carrying out substrate cleaning, and/or annealing, and/or drying, and/or exposure to reactive gas (such as Se vapor or $H_2Se$) in the absence of ALD. Further, the wound substrate can also be surface-treated in the absence of ALD processes, e.g. by carrying out anodization, electrodeposition, electroplating, electropolishing, and/or other reactions in the absence of ALD.

Figure 1B:
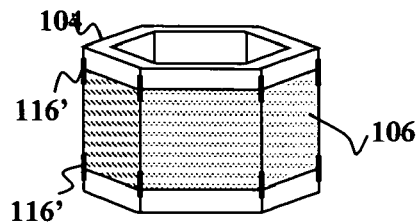
FIG. 1B is a 3-dimensional view schematic diagram of an alternative spindle for winding a substrate according to an embodiment of the present invention.

The carousel 104 may be regarded as a winding drum for the substrate 106, e.g., a foil, such as aluminum foil or another flexible foil such as a plastic or metallized plastic foil. The carousel 104 generally has a number of anchor points for the stackable spacers 116. By way of example, the carousel 104 is depicted as having a hexagonal cylindrical geometry with anchor points located at the edges of a hexagonal cylinder. By way of example, the carousel 104 may be made of six solid plates e.g. of stainless steel, connected into a hexagonal cylinder. Alternatively, the carousel 104 may be made of structural beams (e.g., steel or aluminum tubing or rods) that form an open frame in the shape of a hexagonal cylinder. In addition, the anchor points may stack onto a basic "core" hexagonal cylinder such that the entire structure may be allowed to expand or contract with changes in temperature. Although a hexagonal carousel 104 with six edges is described herein, the carousel 104 may have fewer edges (e.g., 3, 4 or 5 edges) or more edges (e.g., 7, 8 or more) for locating the spacers 116. Alternatively, a round carousel, drum, spindle, or roll may be used. For a carousel of a given diameter, the more anchor points there are the shorter the distance between anchor points and, thus, the less bending stress per contact point there will be on the substrate 106. FIG. 1A shows the spacers 116 as rods along the entire width of the web, connected to locating/fixing points at both ends of the carousel. Alternatively as shown in FIG. 1B, spacers 116' could be fixed at the sides of the substrate 106 only, protruding only partly into the carousel 104 and thereby holding the foil only at the sides, via pressure between adjacent spacers and/or stress on the foil as it is wound. The shorter spacers 116' could, for example, have the shapes as shown in FIGS. 3A–3D. Alternatively, these spacers could be round rods or round wheels at the sides of the substrate 106. Alternatively, the spacer 'rolls/rods' could be knurled.

The carousel 104 and/or surrounding chamber may include an optional substrate temperature control element (e.g., heating and/or cooling element) to maintain the temperature of the substrate 104 within a specified range.

Gas sources 108, 110, supply reactant gases A and B for sequential atomic layer deposition processes that occur in the chamber 102. Gas source 112 may supply an optional non-reactive purge gas C, e.g., an inert gas such as argon or argon. Alternatively, or in addition, reactant gases A and B (or better reactant gases A and B each mixed into a carrier gas such as nitrogen ($N_2$) or argon) could be removed via pumping. The gas sources 110, 112, 116 may selectively supply either reactant gas A or reactant gas B and/or purge gas C though one or more gas lines and one or more valves 113. As described above, a temperature control element may be disposed in the chamber 102 or on the carousel 104 to control the temperature of the substrate 106 and/or chamber 102. Alternatively or in addition, other energy sources could be used, such as energetic particles (from plasma, Ozone, etc.), UV light, etc. At the right range of temperature and/or presence of other energetic species and pressure each reactant gas A, B may participate in a half-reaction at the surface of the substrate 106. When the two half-reactions are performed sequentially a very thin layer of material, e.g., as little as one atomic layer or (more common) part of one monolayer, may be deposited on the substrate 106 as a result of the two half-reactions. By way of example, where reagent A is $TiCl_4$ and reagent B is water vapor ($H_2O$), the two half-reactions deposit a layer of titania ($TiO_2$). Repetition of both half-reactions with appropriate purge/pump cycles in between creates thicker films deposited with high conformality and atomic layer precision.

Atomic layer deposition using these reactants is described, e.g., by M. A. Cameron, et al., in "Atomic Layer Deposition of $SiO_2$ and $TiO_2$ in Alumina Tubular Membranes: Pore Reduction and Effect of Surface Species on Gas Transport," Langmuir 2000, 16, 7425–7444, American Chemical Society, Washington D.C., the disclosures of which are incorporated herein by reference.

Figure 2A:
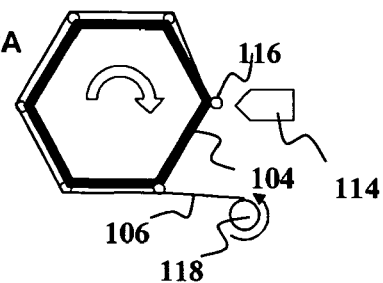
FIGS. 2A–2H are a sequence of schematic diagrams illustrating coiling of a substrate according to an embodiment of the present invention.
Figure 2E:
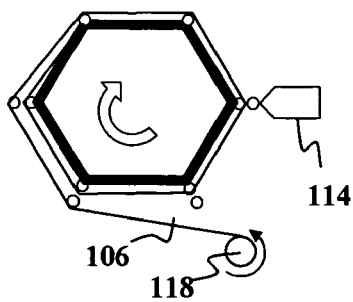
Figure 2B:
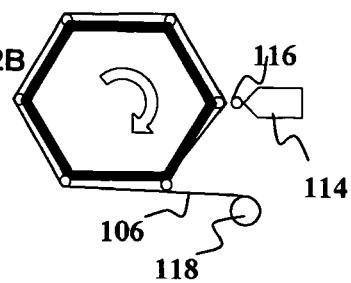
Figure 2F:
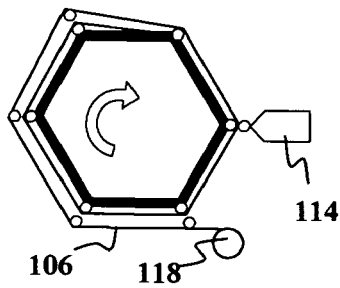
Figure 2C:
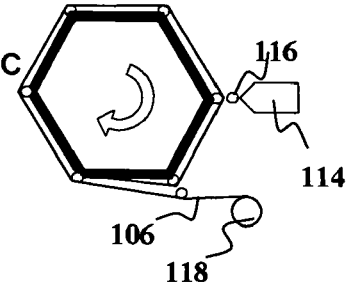
Figure 2G:
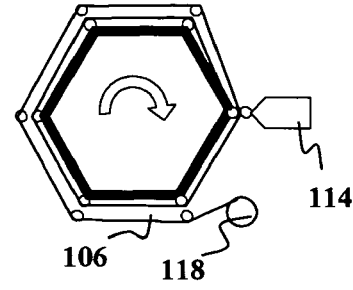
Figure 2D:
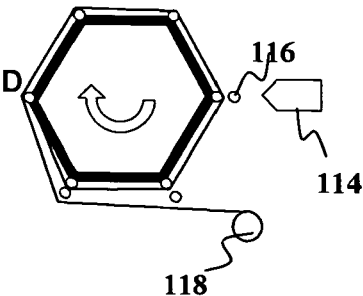
Figure 2H:
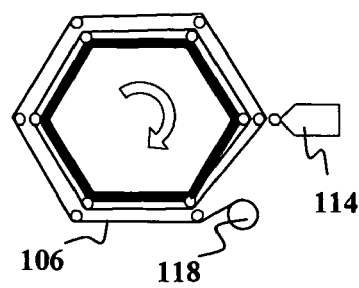

The coiling of the substrate 106 may proceed as depicted in FIGS. 2A–2H. The substrate may be wound onto a conventional roll 118. A portion of the substrate 106 may be unwrapped from the roll 118 and attached to the carousel 104. Spacers 116 may be placed at predetermined locations on the carousel 104. As the carousel 104 turns, the substrate 106 unwinds from the roll 118 and passes over the spacers 116 as shown in FIG. 2A. Alternatively, the roll 118 may be moved circumferentially about the carousel 104 as the substrate 106 unwinds from the roll and is coiled about the carousel 104. It is also possible to coil the substrate by some combination of rotation of the carousel 104 and circumferential movement of the roll around the carousel 104 as the substrate 106 unwinds from the drum 118. Before a full turn (not necessarily the first turn) of the substrate 106 has been coiled around the carousel 104, the robots 114 stack more spacers 116 on those that were initially on the carousel 104 as shown in FIGS. 2B–2D. As the carousel 104 continues to rotate, the substrate 106 continues to unwind from the roll 118 and coil around the carousel 104. A second "turn" of the coiled substrate 106 passes over the spacers 116 as shown in FIGS. 2E–2H. In the example depicted in FIGS. 2A–2H each spacer 116 touches a back surface of the substrate 106 but not a front surface of the substrate 106, thus allowing treatment of substantially all of the front surface of the substrate 106. If the spacers 116 are sufficiently close together, adjacent turns of the coiled substrate 106 may be prevented from touching each other without the need for excessive tension on the substrate 106. The spacing depends partly on the thickness of the substrate 106, partly on the choice of substrate material and partly on the requirements of gas/reactant gas flow and the speed thereof into and out of the areas between foil windings. Tensioning devices may be incorporated into the winding mechanism so that the substrate 106 wraps around the carousel 104 with sufficient tension to keep adjacent turns of the substrate from touching one another. Note, with spacers just mounted on the side, the issue of 'touching' does not arise.

Some high-volume batch processes, e.g., chemical bath deposition (CBD) and atomic layer deposition (ALD), could potentially coat or otherwise treat both sides of the coiled substrate 106 at one time. However, it may be desirable to coat only one side of the substrate 106. Coating or otherwise treating both sides can result in waste of valuable reactants or may lead to extra processing steps such as removing unwanted coatings. To avoid such waste or undesired processing, two substrates may be attached together "back-to-back" to form a dual substrate having, in effect, two front sides with the back sides protected against undesired treatment. Preferably, the substrates are attached in a manner that allows them to be separated from each other after processing. By way of example the substrates may be attached with a low-strength adhesive or electrostatic film applied to the back side of one or both substrates. Alternatively, an edge where the two substrates join may be sealed, e.g., with a tape, so that reactants cannot reach the back sides during processing. The dual substrate may then be wound into a coil and coated such that both front surfaces are treated while the back surfaces are not. Processing the substrate in this fashion may reduce the waste of reactants and may increase the area of the substrate that can be processed at one time.

Figures 3A, 3B:
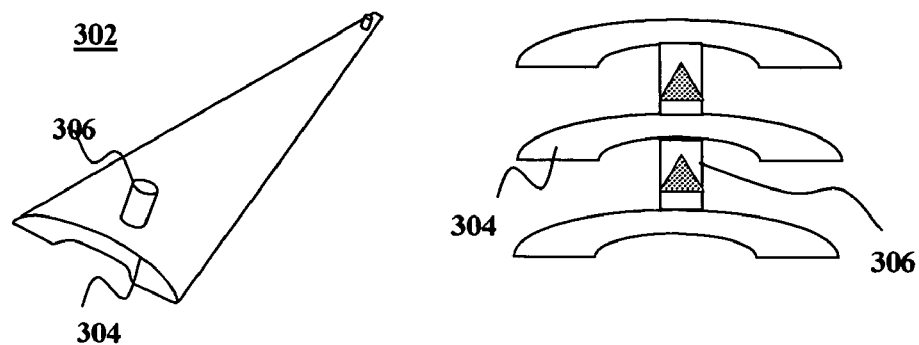
FIG. 3A is a three-dimensional schematic diagram of a spacer that may be used in a coiling a substrate according to an embodiment of the present invention.
FIG. 3B is an end view elevation of a stack of spacers of the type shown in FIG. 3A.

In order to provide sufficient spacing and tension in the substrate 106, several different designs for the spacers 116 may be used. For example, FIGS. 3A–3B depict a spacer 302 having a "stick" type design that may be attached at the edges of a carousel such as the carousel 104 depicted in FIG. 1 and FIGS. 2A–2H. The spacer 302 may include a thin elongated curved plate 304. The curve of the plate 304 may be designed for a specific geometry of the carousel (e.g. a 120° curve for a hexagonal carousel as in FIG. 1). Such a design may advantageously provide smooth contact with the substrate, i.e., without high-pressure contact points. In addition, the shape of the curved plate 304 may provide better strength against bending of the spacer 302. The curved plate 304 can also be made quite thin. Multiple spacers 302 may be stacked on top of one another to facilitate coiling, e.g., as depicted in FIG. 2. By way of example, stacking buttons 306 may be placed near the ends of the curved plate 304. The buttons 306 may snap fit into buttons (holes/recesses) on adjacent spacers so that two or more curved plates 304 may stack, e.g., as depicted in FIG. 3B.

Figures 3C, 3D:
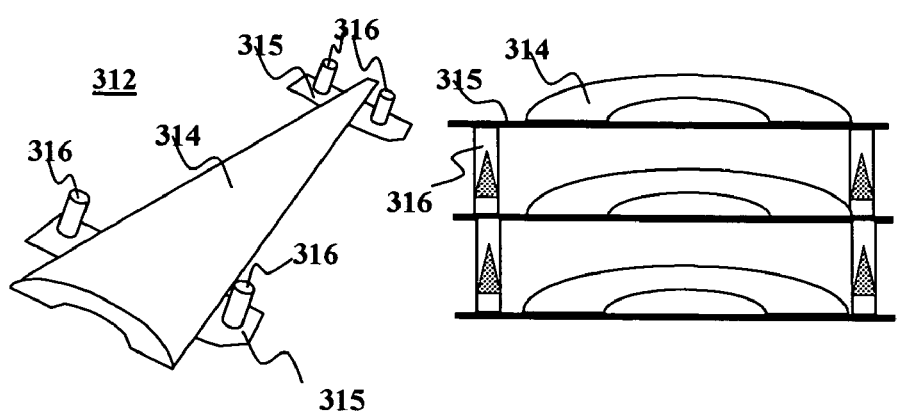
FIG. 3C is a three-dimensional schematic diagram of an alternative spacer that may be used in a coiling a substrate according to an embodiment of the present invention.
FIG. 3D is an end view elevation of a stack of spacers of the type shown in FIG. 3C.

An alternative scheme for stacking spacers is depicted in FIGS. 3C–3D. In this example, a spacer 312 may include a curved plate 314 with a mounting flange 315 attached at each end. Two or more stacking buttons 316 may be attached to each mounting flange 315 so that the curved plate 314 may be supported in a way that is more resistant to twisting. Care needs to be taken to provide spacers with sufficient mechanical stability along the desired width of the web to be able to keep the foil-to-foil separation small (so as to maximize throughput) yet still ensure that the front and back-sides of the substrate 106 do not touch each other.

Other alternative spacer designs are also possible. For example, instead of just a "stick" like spacer, one can also have a 2 dimensional spacer that may support the entire width of the substrate in a structural or solid way. Such a flat-area coil guide may help keeping the foils from touching each other, etc.

Figure 4:
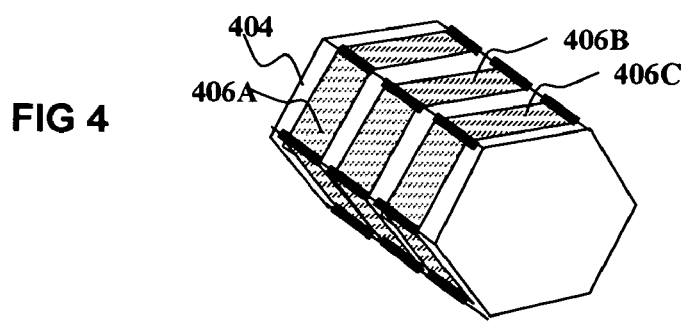
FIG. 4 is a three dimensional schematic diagram of an alternative substrate carousel according to an embodiment of the present invention.

In alternative embodiments of the invention, two or more substrates may be coiled side-by-side on the same carousel, e.g., to increase the total throughput of a system such as that shown in FIG. 1. For example, FIG. 4 depicts three substrates 406A, 406B, and 406C wound around a carousel 404.

Each substrate may be wound on the carousel 404 as described above with respect to FIGS. 2A–2H. The substrates 406A, 406B, and 406C may be wound sequentially or wound simultaneously. They may also be wound separately and then be mounted on a central carrier carousel/spindle. Alternatively, the spacers in FIG. 4 could be placed less than the entire width of the webs 206 A–C, but rather hold the foil only from the sides, e.g., as shown in FIG. 1B.

In another embodiment, spacers can be connected to each other such that the front-side of the substrate 106 is all connected to one power supply terminal via the spacers and the back-side (e.g. via an electrically insulated back-side coating on 106 or an electrically insulated inserted/laminated foil/mesh) of the substrate 106, also via the spacers, whereby the spacers are set up such that one set connects the front sides and another the back sides of the substrate 106. This embodiment can be useful for e.g. a wound-coil-based anodization process that relies on an electro-chemical cell.

Figure 5A:
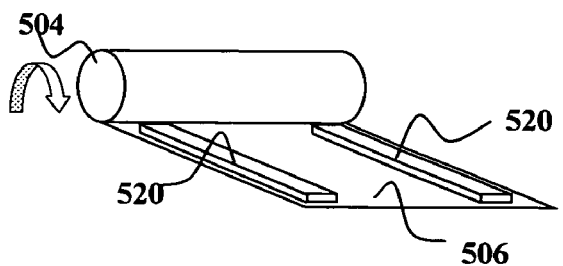
FIGS. 5A–5F illustrate the use of spacer tapes according to embodiments of the present invention.

In another embodiment of the invention, 'spacers' that allow the winding of the substrate 106 onto a carousel (or drum, spindle, roll, etc.) could be 'continuous'. For example, FIG. 5A illustrates a scheme in which a substrate 506 is rolled into a roll onto a spindle 504 and, as the substrate 506, e.g., a foil or other flexible material, is rolled onto the roll, 'spacer tapes' 520 are inserted at the two edges (or alternatively at multiple points along the width of the web; e.g. every few inches, every foot, etc.). The spacer tapes 520 provide contact and grip to the substrate 506 on both sides, assures that the front-sides of the substrate 506 do not touch the back-sides, together with sufficient tension during the winding process. The spacer tape 520 is 'porous' in the sense that gas and/or liquid can flow through the porous material comprising the spacer 'tape' for e.g. the ALD process. This embodiment has the advantage of a continuous contact with the substrate 106 along its entire length, thus, for example, reducing the risk of high pressure/stress points. The spacer tape 520 may be of plastic, a rubber, a foam, metal, composite materials, etc. as long as there are openings of sufficient number and cross section along its side to allow for efficient flow of gases or liquids in and out.

The spacer tapes 520 may be characterized by a width A and a thickness B. The openings in the spacer tape 520 may run substantially parallel to the width A. By way of example, the width A may range from a few millimeters to a few centimeters to tens of centimeters, preferably in the range of a few mm to a few cm. By way of example, the thickness B could be in the range of less than about 1 mm to greater than 1 cm, preferably less than about 5 mm thick. Generally the spacer tape needs to be sufficiently open and gas- or liquid permeable to allow for reasonable process times (e.g. ALD gas fill and pump or purge, ramp time to reach a proper temperature for annealing, etc.). Any such spacer tape should be sufficiently mechanically robust such that when wound up in between turns of the substrate 106, with whatever tension is necessary, the openings in the spacer tape are still substantially open (e.g., not squashed together in the case of e.g. an elastic or 'rubbery' spacer tape).

Figure 5B:
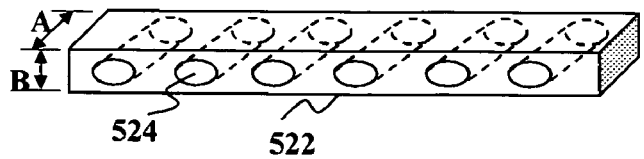
Figure 5C:
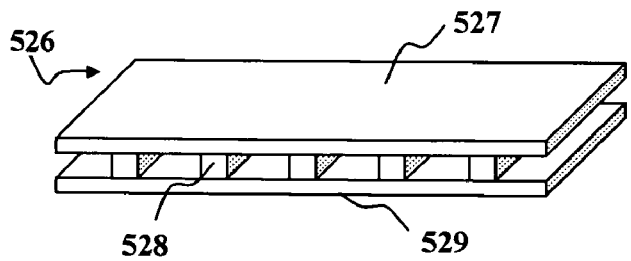

There are several ways of implementing the spacer tape 520. For example, FIG. 5B shows an example of a spacer tape 522 in the form of a strip of unitary material having regularly passages 524 formed therethrough. FIG. 5C shows an alternative example of a spacer tape 526 having a top strip 527, a bottom strip 529 and regularly spaced spacers 528 disposed between them. Gaps 529 between the spacers 528 allow gas to flow through the spacer tape 526. In one example, the spacer tape 526 could have electrically insulating spacers with the top and bottom strips 527, 529 being electrically conductive, e.g. metal tapes. This could be used, for example, in an entire roll-based anodization, electrodeposition, electro-polishing or similar process whereby one part or side of the spacer tape 526 provides electrical contact to one side of the substrate 506 (e.g. a top, coating, or treatment side) and the other to the respective back side of the substrate 506. In this example, one could, for example, use as the substrate 506 a foil (e.g. Al) with an insulating coating or laminate on the back, followed by a conductive (counter-electrode) coating or laminate or mesh (e.g. Pt) at the back of the insulating layer. Here, the conducting top and bottom strips 527, 529 of the spacer tape 526 would make contact to the e.g. Al and Pt side such that a potential, via an outside power supply, can be maintained and e.g. an anodization process could be performed. Also here, the spacer tape 526 would overlap in part with the to-be-treated foil 506 and partially overlap with connectors to connect to a power supply (or potentiostat etc.).

Figure 5D:
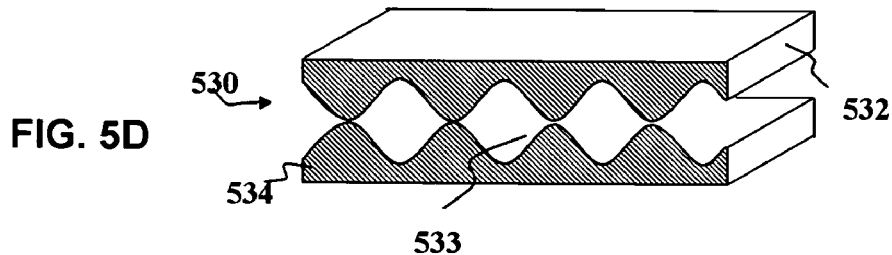
Figure 5E:
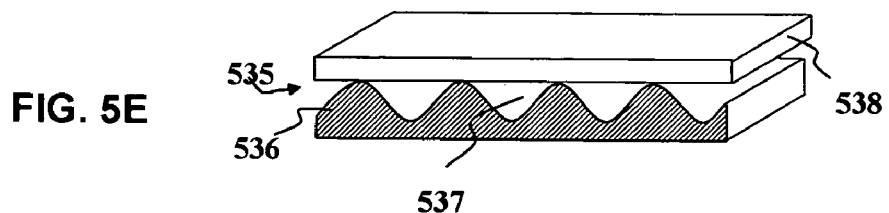
Figure 5F:
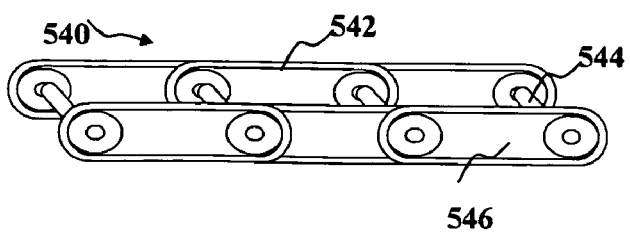

In another embodiment, shown in FIG. 5D, a spacer tape 530 could be a laminate of two 'corrugated' tapes 532, 534 with passages 533 between the corrugations. Alternatively, as shown in FIG. 5E, a spacer tape 535 may be a laminate of one corrugated tape 536 with a flat tape 538 with passages 537 defined by the corrugations. Materials of the tapes may be chosen such that they provide good contact and grip to the substrate 506, match thermal extinction coefficients to be able to maintain sufficient strain or stress on the substrate 506 and carousel to keep the substrate 506 in place, and are chemically compatible with all desired processes etc. In yet another embodiment, shown in FIG. 5F, a spacer tape 540 could be of the form of a 'chain', akin to a bicycle chain whereby links 542 (e.g. small rolls/connectors, or flat or slightly bent parts) having through passages are pivotally connected together in a flexible and 'windable' fashion. By way of example, the links 542 may be coupled by hollow tubes 544 that allow gas or liquid to pass. Alternatively 'side parts' 546 of the links 542 may be open to let gas/liquid pass. The individual side parts 546 may also be solid pieces of plastic or metal with tubular holes at the ends for the links plus openings in the solid pieces for the gas/liquid.

Those of skill in the art will be able to devise spacer tapes in other forms of continuous tapes, bands, or chains with openings along the sides to let e.g. ALD gases through. Such tapes could be disposable tapes to be used once and then discarded or reusable tapes to be used many times.

Figure 6A:
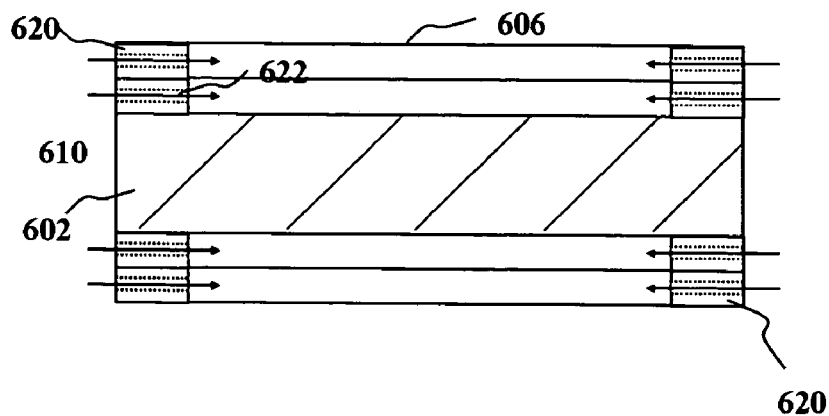
FIGS. 6A is a cross-sectional schematic illustrating a substrate with spacer tapes wound on a spindle according to embodiments of the present invention.
Figure 6B:
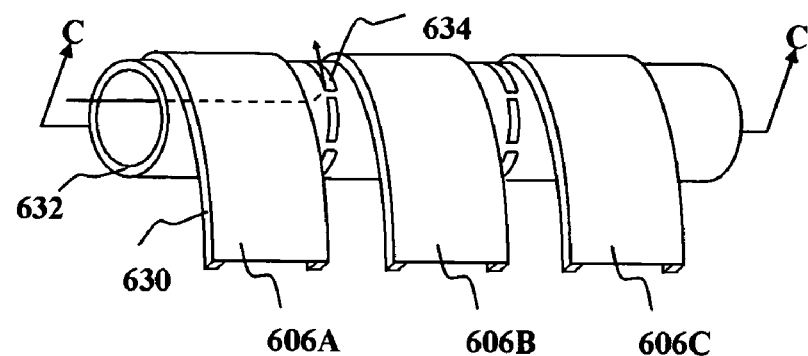
FIG. 6B is a perspective schematic diagram illustrating multiple substrates wound side-by-side on a spindle according to an embodiment of the present invention.
Figure 6C:
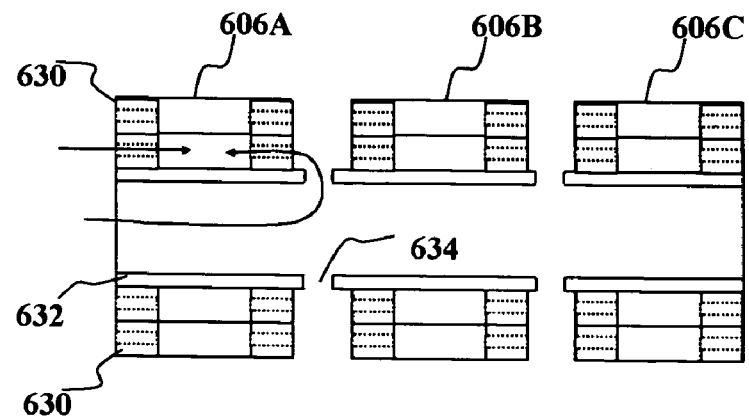
FIG. 6C is a cross-sectional schematic diagram taken along line C—C of FIG. 6B.

FIGS. 6A–6C illustrate how substrates can be wound using spacer tapes according to embodiments of the present invention. For example, in the side cross-sectional diagram of FIG. 6A, a substrate 606 e.g. a foil, may be clamped to a central roll, drum, or spindle 602 (e.g., by a mechanical clamp or adhesive.) and then the substrate 606 is wound up with intermediate spacer tapes 620. Gases 610, e.g., ALD reactants or purge gases, enter the spaces between the turns of the substrate via openings 622 in the sides of the spacer tapes 620, e.g., as described above. Although FIG. 6A shows only two spacer tapes 620 at the ends of the substrate 606, more could be used, e.g. to provide support in case of a wider foil. In such a case, the central spacer tapes (not shown in FIG. 6A would create non-ALD-coated or non-treated areas on substrate 606 and this can be designed such that these non-treated/non-coated areas are those that don't need to be for the final product. For example, in a photovoltaic (PV) cell, parts of the foil that are used for e.g. series and/or parallel-wiring of adjacent individual PV cells to e.g. a higher voltage PV module. Alternatively, the non-coated or non-treated areas could be areas reserved for later encapsulation.

In another embodiment depicted in FIGS. 6B–6C, a main drum, roll, or spindle 632 could be used to wind/unwind several narrower substrates 606A, 606B, 606C side-by side. By way of example, 5 1-foot wide foils or rolls may on wound on an e.g. 6 foot wide spindle). Spacer tapes 630 may be located at the sides of each substrate. 606A, 606B, 606C. Thus, there would be additional areas (see arrows) for the ALD gas to enter/leave the central wound-up coating areas from both sides. By keeping the individual substrates 606A, 606B, 606C narrower there is less of a problem with stress and less likelihood that the front and back sides of substrates 606A, 606B, 606C will touch each other. In such an embodiment, the spindle 632 may be hollow and provided with slots 634 to facilitate the passage of gas.

In another embodiment, individual rolls/webs, e.g. 6", 1 ft etc. wide could be wound up using various embodiments of the present invention (spacer rods along entire web width, spacers at web sides/edges; spacer tape, etc.) and multiple of said rolls could then be mounted on a larger central spindle, ready for transfer into a treatment chamber.

The advantages of the coiled substrate approach of the embodiments of the present invention may be illustrated by a numerical example. Consider a coiled substrate that can fit into 16'×16'×12' space. Assume that the coil has an inner diameter of 1 meter (e.g., for a hexagonal carousel, the distance from the center to an edge of a hexagon). Assume that the coil has an outer diameter of 3 meters and that the width of the coil is 2 meters and the carousel is a little wider, e.g., 2.4 meters wide. Each turn of the coiled substrate is 1 meter long between the edges of the hexagon initially and 3 meters long when fully wound. The average length of each turn of the coiled substrate is thus 6 sides X 2 m/side. If the substrate has a thickness of 0.025 mm and adjacent turns of the coiled substrate are 1 mm apart, then the coiled substrate would have about 2 m/1.025 mm=~2,000 turns about the carousel. The total area of the coiled substrate would be 2,000 X 2 m X 6 X 2 m=48,000 m².

In this numerical example, suppose that a deposition requires 25 repetitions of the four step sequence ACBC, i.e., filling the chamber with reactant A, purge with inert gas C, fill with reactant B, purge with inert gas C. If each purge, pump or fill step takes 10 minutes, the throughput may be estimated as the total area divided by the total number of steps and the time per step, e.g., 48,000 m²/10 min/step /100 steps=48 m²/min>500 square feet per minute. If the time for each step can be reduced to only 1 minute, the throughput may be increased to >5,000 square feet per minute.

In embodiments of the present invention, the scaling of the ALD process is geared towards surface area maximization, not necessarily process step speed, thus leaving enough time for each step. Consequently, pumping, purging and filling can be ensured to be high quality, thus minimizing loss of coating quality by intermixing gases, etc. Although the whole process may take a considerable period of time to complete, a vast surface area of substrate may be coated at one time. Furthermore, the same coil/coil process can be used for other surface treatment processes, e.g., anodization, that precede or follow the ALD process, thus obviating the need for and cost of many wind/unwind steps. In addition, the same coil/coil process can be used for other surface treatment processes, e.g. heating, cooling, annealing, drying, exposure to reactive gas, etc., independent of any ALD process, providing a generalized means for high-throughput surface treatment of coiled flexible substrates.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. The appended claims are not to be interpreted as including means-plus-function limitations, unless such a limitation is explicitly recited in a given claim using the phrase "means for."

What is claimed is:

1. A method for treating a substrate surface, the method comprising:
    coiling one or more substrates into one or more coils in such a way that adjacent turns of the coils do not touch one another and define a gap that allows for flow between adjacent turns of the coils;
    placing the one or more coiled substrates in a treatment chamber; and
    in the treatment chamber, treating substantially an entire surface of the one or more coiled substrates with a surface treatment process, wherein the surface treatment process includes one or more atomic layer deposition (ALD) reactions;
    wherein at least one or more of the substrates comprises a flexible, planar elongated member.

2. The method of claim 1 wherein the one or more ALD reactions include exposing the surface of the coiled substrate to a reactant vapor of the type MClx, where M is a metal and x is an integer from one to four.

3. The method of claim 2, wherein the one or more ALD reactions include exposing the surface of the coiled substrate to water vapor.

4. The method of claim 2 wherein MClx is TiCl4.

5. The method of claim 1 wherein coiling the substrate includes attaching an end of a roll of substrate material to a carousel, rotating the carousel while unrolling the substrate material from the roll to coil the substrate around the carousel, and placing one or more spacers between adjacent layers of the coiled substrate before the carousel completes a turn.

6. The method of claim 5 wherein each spacer touches a back surface of the substrate but not a front surface of the substrate.

7. The method of claim 5 wherein placing one or more spacers includes stacking one or more spacers on top of one another.

8. The method of claim 1 wherein coiling the substrate includes attaching an end of a roll of substrate material to a carousel, moving the roll of substrate material around the carousel while unrolling the substrate material from the roll to coil the substrate around the carousel, and placing spacers between adjacent layers of the coiled substrate before the roll completes a turn about the carousel.

9. The method of claim 1 wherein the one or more substrates include two or more substrates coiled side-by-side on a carousel.

10. The method of claim 1 wherein coiling one or more substrates into one or more coils in such a way that adjacent turns of the coils do not touch one another includes placing a spacer tape between adjacent turns of the substrate.

11. The method of claim 10 wherein the spacer tape is orientated substantially parallel to a length of the substrate.

12. The method of claim 10 wherein the spacer tape includes one or more passages running substantially along a width of the spacer tape.

13. The method of claim 1 wherein the surface treatment creates a layer by using a self-limiting surface reaction on at least one side of the substrate from one adjacent turn to another.

14. The method of claim 1 wherein the elongated member has an uncoiled length greater than a width of the chamber.

15. The method of claim 1 wherein at least about 500 square feet of at least one of the substrates is coated per minute.

16. A method for treating a substrate surface, the method comprising:
   coiling one or more substrates into one or more coils in such a way that adjacent turns of the coils do not touch;
   placing the one or more coiled substrates in a treatment chamber; and in the
   treatment chamber, treating substantially an entire surface of the one or more coiled substrates with a surface treatment process,
      wherein the surface treatment process includes one or more atomic layer deposition (ALD) reactions,
      wherein coiling one or more substrates includes attaching two substrates together back-to-back to form a dual substrate and coiling the dual substrate.

17. The method of claim 16, further comprising separating the two substrates after they have been treated in the treatment chamber.

18. A method for treating a substrate surface, the method comprising:
   coiling one or more substrates into one or more coils in such a way that adjacent turns of the coils do not touch one another;
   placing the one or more coiled substrates in a treatment chamber; and
   in the treatment chamber, treating substantially an entire surface of the one or more coiled substrates with a surface treatment process, wherein the surface treatment process includes one or more atomic layer deposition (ALD) reactions;
   wherein at least one or more of the substrates comprises a flexible, planar elongated member;
   wherein the surface treatment process using one or more coiled substrates has an effective throughput at least 2 times greater than the same process using an uncoiled substrate that can fit in the same chamber and undergo the ALD reactions;
   wherein the effective throughput of the treatment chamber comprises a total surface area treated per unit time in a single batch process.

19. The method of claim 18 wherein at least about 500 square feet of the one or more substrates is coated per minute.

20. The method of claim 18 wherein at least about 500 to about 5000 square feet of the one or more substrates is coated per minute.

21. The method of claim 18 wherein at least about 10 to about 100000 square feet of the one or more substrates is coated per minute.

22. The method of claim 18 wherein the effective throughput is at least 10 times greater than the same process using the uncoiled substrate that can fit in the same chamber.

23. The method of claim 18 wherein the effective throughput is at least 100 times greater than the same process using the uncoiled substrate that can fit in the same chamber.

24. The method of claim 18 wherein the effective throughput is at least 1000 times greater than the same process using the uncoiled substrate that can fit in the same chamber.

25. The method of claim 18 wherein the effective throughput is at least 2300 times greater than the same process using the uncoiled substrate that can fit in the same chamber.

26. The method of claim 18 wherein the elongated member has an uncoiled length greater than a width of the chamber.

27. The method of claim 18 wherein an area of at least one of the substrates being treated in the chamber is greater than a cross-sectional area of the chamber.

28. The method of claim 18 wherein the substrate is a metallic, conductive substrate.

* * * * *